United States Patent
Zang et al.

(10) Patent No.: US 10,741,656 B2
(45) Date of Patent: Aug. 11, 2020

(54) WRAPAROUND CONTACT SURROUNDING SOURCE/DRAIN REGIONS OF INTEGRATED CIRCUIT STRUCTURES AND METHOD OF FORMING SAME

(71) Applicant: GLOBALFOUNDRIES INC., Grand Cayman (KY)

(72) Inventors: Hui Zang, Guilderland, NY (US); Ruilong Xie, Schenectady, NY (US); Shesh M. Pandey, Saratoga Springs, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/121,014

(22) Filed: Sep. 4, 2018

(65) Prior Publication Data

US 2020/0075738 A1    Mar. 5, 2020

(51) Int. Cl.
| | |
|---|---|
| H01L 29/417 | (2006.01) |
| H01L 29/78 | (2006.01) |
| H01L 29/66 | (2006.01) |
| H01L 29/08 | (2006.01) |
| H01L 21/3213 | (2006.01) |

(52) U.S. Cl.
CPC .. *H01L 29/41791* (2013.01); *H01L 21/32134* (2013.01); *H01L 29/0847* (2013.01); *H01L 29/66545* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | |
|---|---|---|
| 9,812,453 B1 | 11/2017 | Mulfinger et al. |
| 9,847,390 B1 | 12/2017 | Xie et al. |
| 2008/0210294 A1 | 9/2008 | Moslehi |
| 2008/0289684 A1 | 11/2008 | Moslehi |
| 2014/0001520 A1* | 1/2014 | Glass ............... H01L 29/66439 257/288 |
| 2019/0043944 A1 | 2/2019 | Stoker et al. |

OTHER PUBLICATIONS

U.S. Appl. No. 15/667,376, Office Action dated May 30, 2018, 9 pages.
U.S. Appl. No. 15/667,376, Response to Office Action dated Jul. 30, 2018, 9 pages.
U.S. Appl. No. 15/667,376, Notice of Allowance dated Oct. 9, 2018, 7 pages.

* cited by examiner

*Primary Examiner* — Long Pham
(74) *Attorney, Agent, or Firm* — Francois Pagette; Hoffman Warnick LLC

(57) ABSTRACT

This disclosure is directed to an integrated circuit (IC) structure. The IC structure may include a semiconductor substrate having a first fin and a second fin spaced from the first fin; a first source/drain region in the first fin, the first source/drain region encompassing a top surface and two opposing lateral sides of the first fin; a second source/drain region in the second fin, the second source/drain encompassing a top surface and two opposing lateral sides of the second fin; and a metal contact extending over the first source/drain region and the second source/drain region and surrounding the top surface and at least a portion of the two opposing lateral sides of each of the first and the second source/drain regions.

6 Claims, 14 Drawing Sheets

WRAPAROUND CONTACT SURROUNDING SOURCE/DRAIN REGIONS OF INTEGRATED CIRCUIT STRUCTURES AND METHOD OF FORMING SAME

BACKGROUND

Technical Field

The present disclosure relates to integrated circuit (IC) manufacture. More particularly, the disclosure relates to forming generally fork-shaped contacts around source/drain regions to increase contact area and improve device performance.

Related Art

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. By applying an appropriate voltage to the gate electrode, the channel region becomes conductive and current is allowed to flow from the source region to the drain region. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. Continued development of transistor architectures has yielded dimensional improvements to FET technology, such as "gate all around" (GAA) device architectures.

In some cases, one or more epitaxial growth processes are performed to form epitaxial (epi) semiconductor material in recesses formed in the source/drain regions of the FinFET device. In some cases, the epi material may be formed in the source/drain regions without forming any recesses in the substrate for a FinFET device, or the recesses may be overfilled, thus forming raised source/drain regions. The gate structures for such FinFET devices may be manufactured using so-called "replacement gate" (gate-last) manufacturing techniques.

To improve the operating speed of FETs, and to increase the density of FETs on an integrated circuit, device designers have greatly reduced the physical size of FETs over the years. A number of challenges arise as feature sizes of FETs and integrated circuits get smaller.

In FinFETs, a wrap-around contact (WAC) may be formed over most of the outer surface of source/drain regions in order to reduce resistance in the FinFET. In previous methods, in order to ensure that the WAC is formed around most of the outer surface of source/drain regions, a large contact area is etched over the source/drain regions such that all outer surfaces of the source/drain regions are exposed, even in a worst-case misalignment scenario. The large contact area limits the device scaling because the spacing between individual devices is limited by the width of the contact area used to form the WAC. Source/drain regions may also span multiple adjacent fins with a common gate formed on each of the fins. Source/drain regions on adjacent fins may fuse together when initially formed by epitaxial growth processes or during subsequent epitaxial growth processes. Fusing (or near fusing) of source/drain regions reduces the surface area available for electrical conduction between the contact and the source/drain region. Additionally, the geometry of source/drain regions formed by previous methods has the undesirable results of a longer average distance for charge carriers to travel through the source/drain region to reach the active channel and concentration of current flow through the top of the channel.

SUMMARY

All examples and features mentioned below can be combined in any technically possible way.

Various embodiments of the disclosure include methods of forming integrated circuits. Various additional embodiments of the disclosure include IC structures, such as source/drain regions and source/drain contacts, formed according to the disclosed methods.

A first aspect of the disclosure is directed to an integrated circuit structure including: a semiconductor substrate, including a first fin and a second fin spaced from the first fin; a first source/drain region in the first fin, the first source/drain region encompassing a top surface and two opposing lateral sides of the first fin; a second source/drain region in the second fin, the second source/drain region encompassing a top surface and two opposing lateral sides of the second fin; and a first metal contact extending over the first source/drain region and the second source/drain region and surrounding the top surface and at least a portion of the two opposing lateral sides of each of the first and the second source/drain regions.

A second aspect of the disclosure is directed to an integrated circuit structure, including: a semiconductor substrate; a plurality of semiconductor fins extending from the substrate; a first set of source/drain regions each positioned in one fin of a first subset of adjacent fins of the plurality of fins, each source/drain region of the first set of source/drain regions encompassing a top surface and two opposing lateral sides of a respective fin, wherein the first subset of adjacent fins includes at least two fins; a second set of source/drain regions each positioned in one fin of a second subset of adjacent fins of the plurality of fins, each source/drain region of the second set of source/drain regions encompassing a top surface and two opposing lateral sides of a respective fin, wherein the second subset of adjacent fins includes at least two fins and the second subset of adjacent fins are different than the first subset of adjacent fins; a first metal contact positioned over the first set of source/drain regions, wherein the first metal contact surrounds the top surface and at least a portion of the two opposing lateral sides of each source/drain region of the first set of source/drain regions; and a second metal contact positioned over the second set of source/drain regions, wherein the second metal contact surrounds the top surface and at least a portion of the two opposing lateral sides of each source/drain region of the second set of source/drain regions.

A third aspect of the disclosure is directed to a method of forming an integrated circuit structure, including providing a precursor structure including: a semiconductor substrate, including a first fin and a second fin spaced from the first fin; and a dummy gate positioned on the first fin and the second fin; forming a first source/drain region in a first portion of the first fin and a second source/drain region in a second portion of the second fin, wherein the first source/drain region is between a first pair of fin spacers positioned on two opposing lateral sides of the first fin, and the second source/drain region is between a second pair of fin spacers positioned on two opposing lateral sides of the second fin, and wherein the first source/drain region is spaced from the second/source drain region; etching to remove the first pair of fin spacers and the second pair of fin spacers; forming a dummy contact on both the first source/drain region and the second source/drain region, wherein the dummy contact surrounds a top surface and at least a portion of the two opposing lateral sides of each of the first source/drain region and the second source/drain region; depositing a second interlayer dielectric on the dummy contact; forming a first opening in the second interlayer dielectric to the dummy contact; removing the dummy contact, creating a second opening; and forming a metal contact in the first opening and the second opening, wherein the metal contact surrounds a top surface and at least a portion of the two opposing lateral sides of each of the first source/drain region and the second source/drain region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures. In the drawings, like numbering represents like elements between the drawings.

It is noted that the drawings of the disclosure are not to scale. The drawings are intended to depict only typical aspects of the disclosure, and therefore should not be considered as limiting the scope of the disclosure.

DETAILED DESCRIPTION

In the following description, reference is made to the accompanying drawings that form a part thereof, and in which is shown by way of illustration specific representative embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Throughout this disclosure, the terms top, upper, upwards, over, and above refer to the direction away from the substrate. Likewise, the terms bottom, lower, downwards, under, and below refer to the direction towards the substrate.

Figure 1:
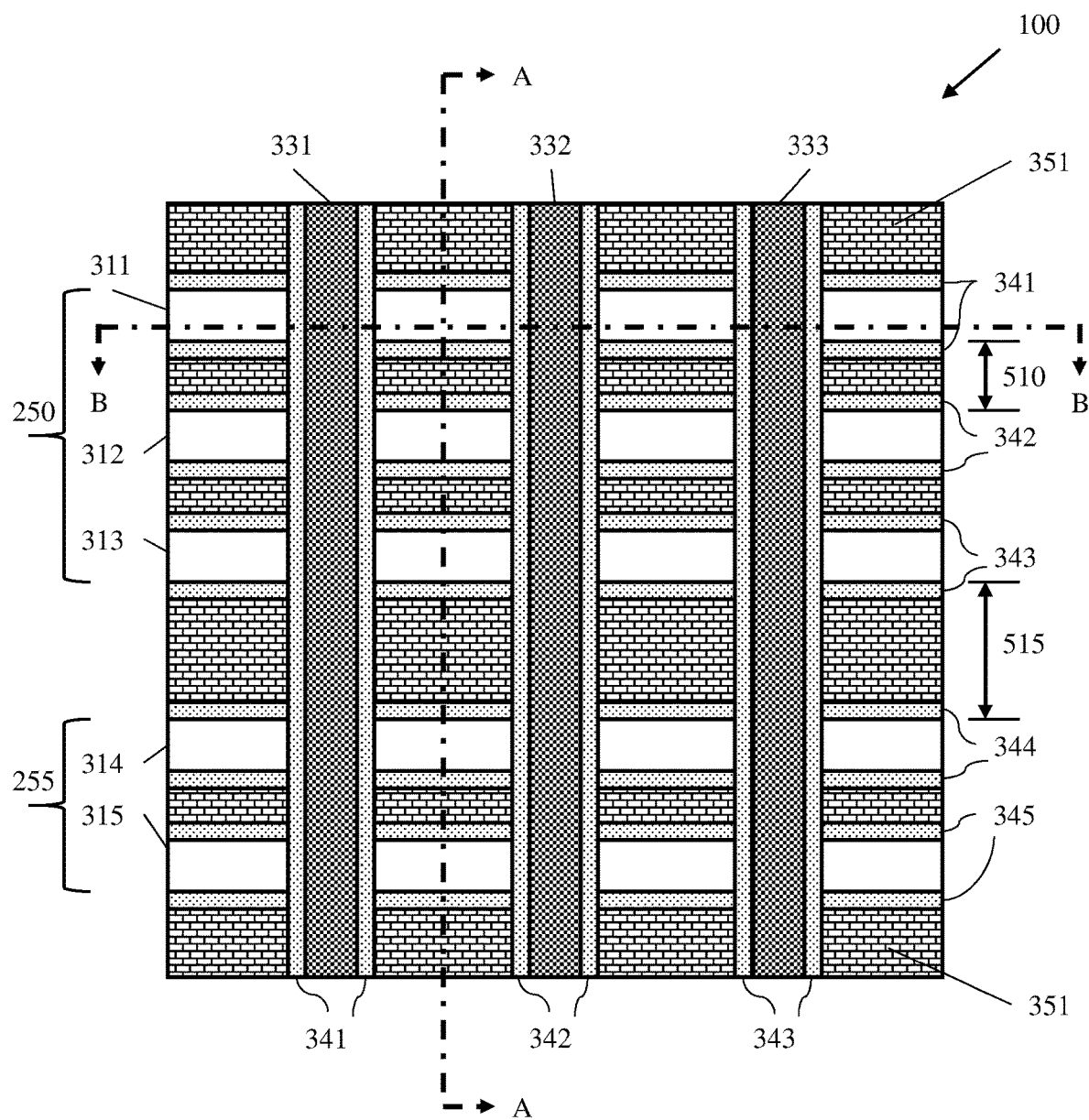
FIG. 1 shows a plan view of an example precursor structure according to embodiments of this disclosure. The line A-A designates cross section locations for FIGS. 2-12A, and the line B-B designates cross section locations for FIGS. 2-12B.
Figure 2A:
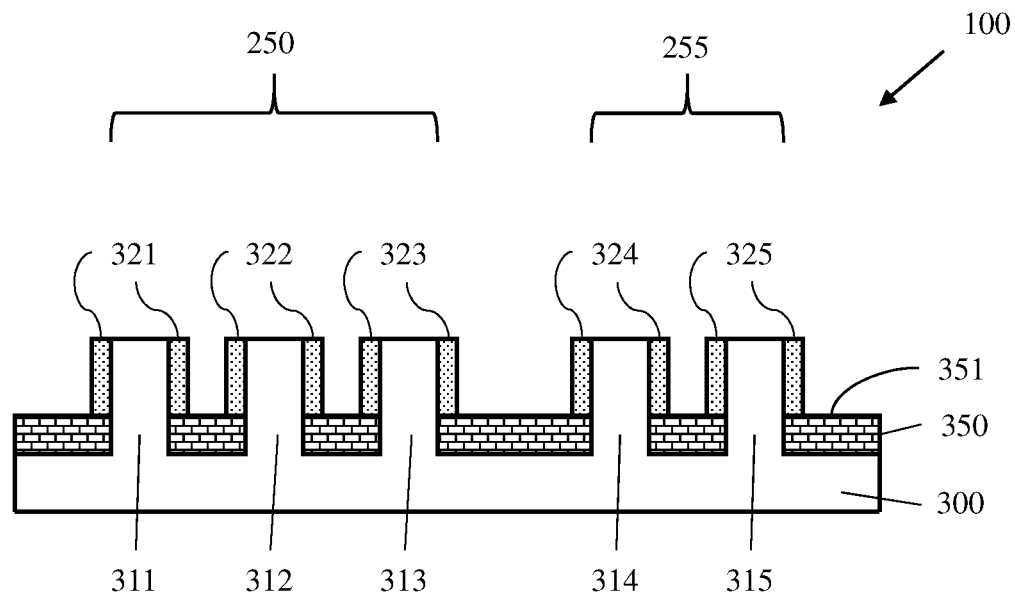
FIGS. 2A and 2B each show a cross section of the example precursor structure shown in FIG. 1.
Figure 2B:
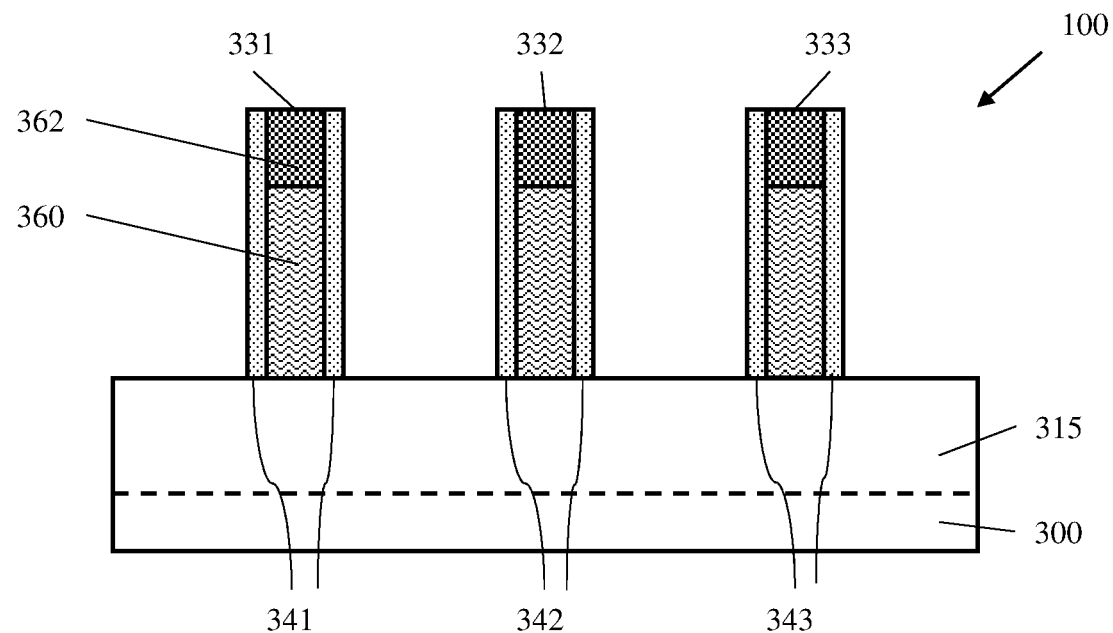

FIGS. 1, 2A, and 2B together show an example precursor structure 100 to be processed according to embodiments of this disclosure. FIG. 1 is a plan view of the example precursor structure 100. For clarity, hidden structures are not shown in phantom in FIG. 1. In the following FIGS. 2A-12B, a figure suffixed "A" is a cross section of the partially processed IC structure along a line corresponding to the line A-A in FIG. 1 and a figure suffixed "B" is a cross section of the same partially processed IC structure along a line corresponding to the line B-B in FIG. 1.

The example precursor structure 100 illustrates one set of materials targeted for use with embodiments of the disclosure, but it is understood that embodiments of the disclosure can be implemented on different designs without any change to the techniques discussed herein. Precursor structure 100 may include a semiconductor substrate 300 with a plurality of fins 311, 312, 313, 314, 315 spaced apart from one another and extending upward from the substrate. First interlayer dielectric 350 may be positioned on portions of the upper surface of semiconductor substrate 300 and includes a first interlayer dielectric upper surface 351. Pairs of fin spacers 321, 322, 323, 324, 325 may be positioned above substrate 300 abutting opposing lateral sides of each respective fin 311, 312, 313, 314, 315. Dummy gates 331, 332, 333 may be positioned on fins 311, 312, 313, 314, 315 and above substrate 300 with an orientation approximately perpendicular to fins 311, 312, 313, 314, 315. Pairs of gate spacers 341, 342, 343 may be positioned above substrate 300 abutting opposing lateral sides of each respective dummy gate 331, 332, 333. Dummy gates 331, 332, 333 may each include a sacrificial gate material 360, e.g., polysilicon, and a protective cap 362 including, e.g., silicon nitride (chemical formula $Si_3N_4$).

Fins 311, 312, 313, 314, 315 may be grouped into any number of distinct subsets 250, 255 of adjacent fins. Subsets of adjacent fins may include two or more fins. Source/drain regions formed immediately alongside one another on adjacent fins within a subset will typically share a common source/drain contact and correspond to a single circuit element when the integrated circuit structure is completed. Fins within a subset may have an approximately equal first spacing 510 between each fin, and subsets of fins may be separated from one another by a second spacing 515 different than first spacing 510. Typically, second spacing 515 will be larger than first spacing 510. In some embodiments according to this disclosure, second spacing 515 will be less than three times first spacing 510. One benefit of the integrated circuit structure and method described in this disclosure is this reduced spacing between adjacent circuit elements compared to conventional methods.

Substrate 300 is typically a wafer of semiconductor material such as silicon, germanium, silicon germanium, silicon carbide, and those consisting essentially of III-V compound semiconductors such as GaAs, II-VI compound semiconductors such as ZnSe. A substrate 300 may also comprise an organic semiconductor or a layered semiconductor such as, for example, Si/SiGe, a silicon-on-insulator or a SiGe-on-insulator. A portion or entire semiconductor substrate 300 may be amorphous, polycrystalline, or monocrystalline.

Substrate 300 materials may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Pairs of fin spacers 321, 322, 323, 324, 325 and pairs of gate spacers 341, 342, 343 may include a dielectric and may be formed by any process now known or later developed in the art. A dielectric is a non-conducting-material or substance, or in other words a dielectric is an electrical insulator. Some dielectrics commonly used in spacers are $SiO_2$ ("oxide") and $Si_3N_4$ ("nitride"). Conventional means can be used to apply the dielectric layer, such as chemical vapor deposition (CVD).

First interlayer dielectric (ILD) 350 may include any dielectric material including inorganic dielectric materials, organic dielectric materials, or combinations thereof, and may be deposited by any now known or later developed technique appropriate for depositing ILDs. Suitable dielectric materials include but are not limited to: silicon nitride ($Si_3N_4$), silicon oxide ($SiO_2$), carbon-doped silicon dioxide materials; fluorinated silicate glass (FSG); boro-phosphosilicate glass (BPSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

A process for forming a plurality of source/drain regions in fins 311, 312, 313, 314, 315 is illustrated in FIGS. 3A-6B. As will be noted below, some of the illustrated steps may be omitted and additional steps may be included without departing from the scope and spirit of this disclosure. Unlike conventional FinFET source/drain regions, source/drain regions formed by methods according to embodiments of this disclosure are not fused with source/drain regions on adjacent fins. Because the source/drain regions are not fused together, contacts may be formed which surround a larger surface area of the source/drain regions than is possible with conventional structures.

Figure 3A:
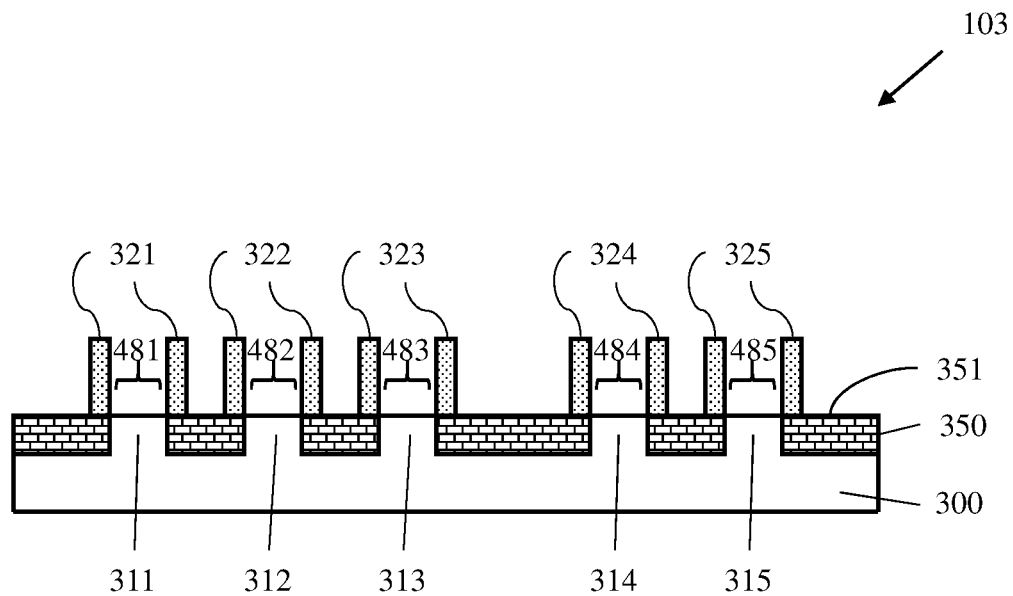
FIGS. 3A and 3B each show a cross section of removing a portion of the fins of the precursor structure, and the resulting structure according to embodiments of this disclosure.
Figure 3B:
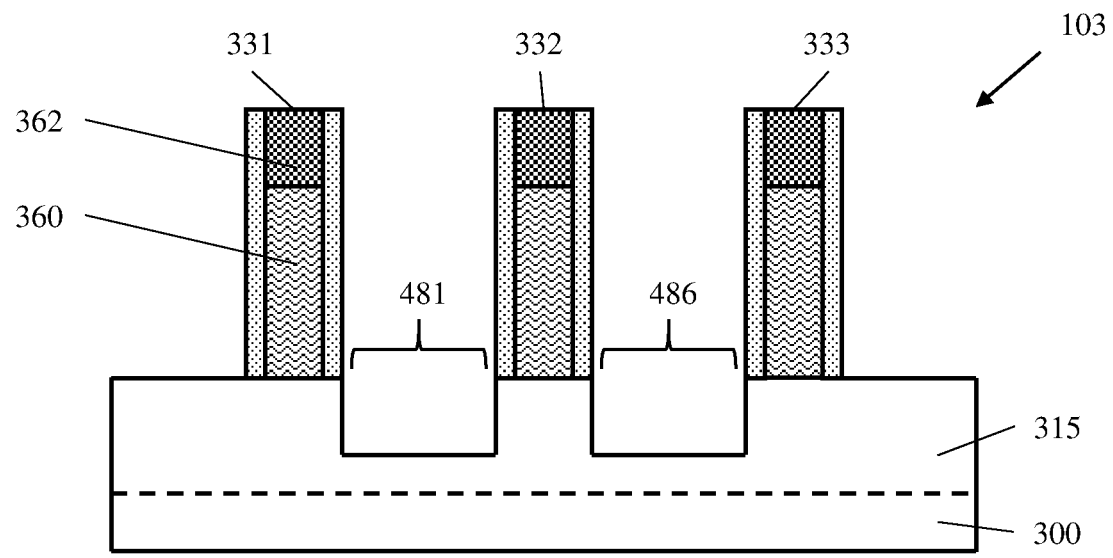

As shown in cross section FIGS. 3A and 3B, portions of fins 311, 312, 313, 314, 315 between pairs of fin spacers 321, 322, 323, 324, 325 and adjacent to dummy gates 331, 332, 333 may be removed to form recesses 481, 482, 483, 484, 485, 486. Recesses 481, 482, 483, 484, 485, 486 may be formed by any now known or later developed techniques appropriate for removing portions of a fin, including but not limited to etching, resulting in partially processed IC structure 103.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 4A:
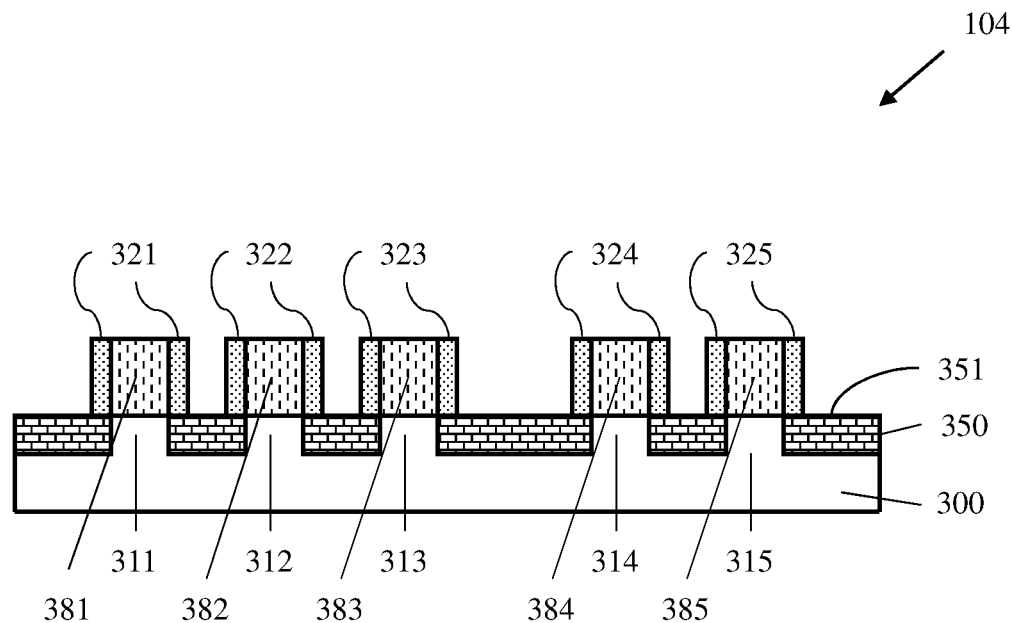
FIGS. 4A and 4B each show a cross section of forming source/drain regions in the fins, and the resulting structure according to embodiments of this disclosure.
Figure 4B:
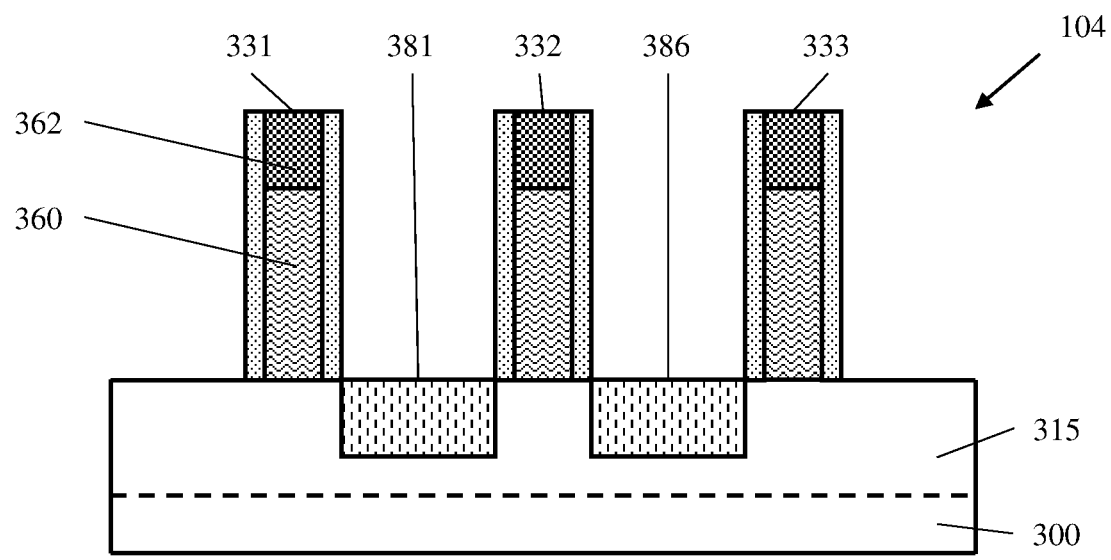

Source/drain regions 381, 382, 383, 384, 385, 386 may be formed in portions of fins 311, 312, 313, 314, 315 between pairs of fin spacers 321, 322, 323, 324, 325 and adjacent to dummy gates 331, 332, 333 as shown in cross section FIGS. 4A and 4B. Source/drain regions 381, 382, 383, 384, 385, 386 may be formed by any now known or later developed techniques appropriate for forming source/drain regions, resulting in partially processed IC structure 104.

One known technique for forming source/drain regions 381, 382, 383, 384, 385, 386 is depositing doped semiconductor material in previously formed recesses 481, 482, 483, 484, 485, 486. Depositing doped semiconductor material in recesses may be accomplished by techniques including epitaxial growth of semiconductor including dopants, or by epitaxial growth followed by a separate doping process. Alternatively, source/drain regions 381, 382, 383, 384, 385, 386 may be formed by doping portions of fins 311, 312, 313, 314, 315 without first forming recesses. When initially formed, source/drain regions 381, 382, 383, 384, 385, 386 are confined between respective pairs of fin spacers 321, 322, 323, 324, 325.

The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Doping is the process of introducing impurities (dopants) into the semiconductor substrate, or elements formed on the semiconductor substrate, and is often performed with a mask (or previously-formed, elements in place) so that only certain areas of the substrate will be doped. For example, doping is used to form the source and drain regions of a FinFET. An ion implanter is typically employed for the actual implantation. An inert carrier gas such as nitrogen is usually used to bring in the impurity source (dopant). A dopant is an element introduced into semiconductors to establish either p-type or n-type conductivity. Common dopants in silicon for p-type include but are not limited to boron (B) and Indium (In) and for n-type include but are not limited to phosphorous (P), arsenic (As), and antimony (Sb).

Figure 5A:
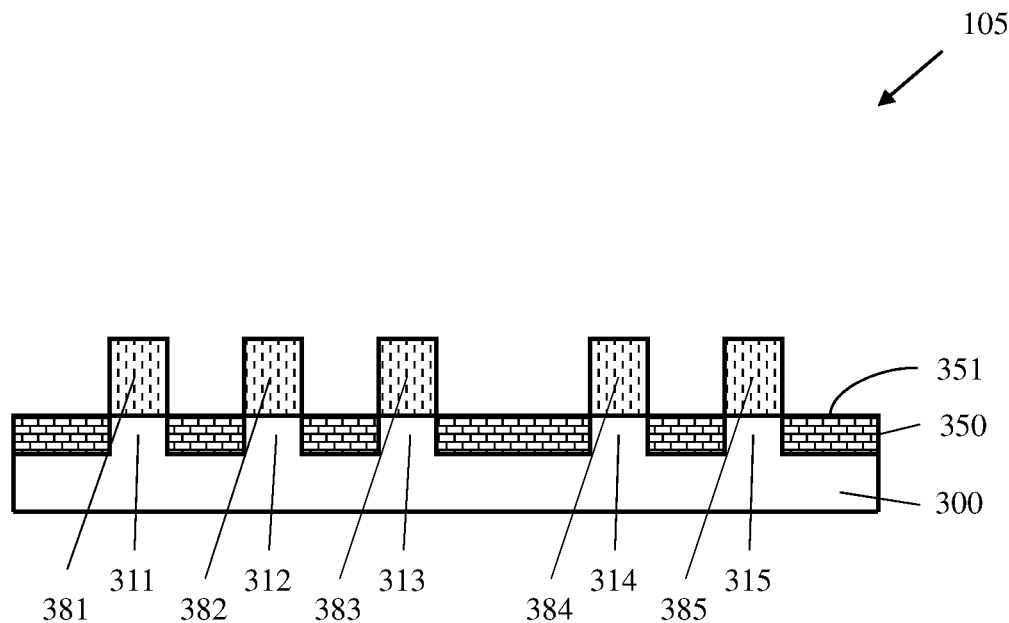
FIGS. 5A and 5B each show a cross section of etching to remove fin spacers, and the resulting structure according to embodiments of this disclosure.
Figure 5B:
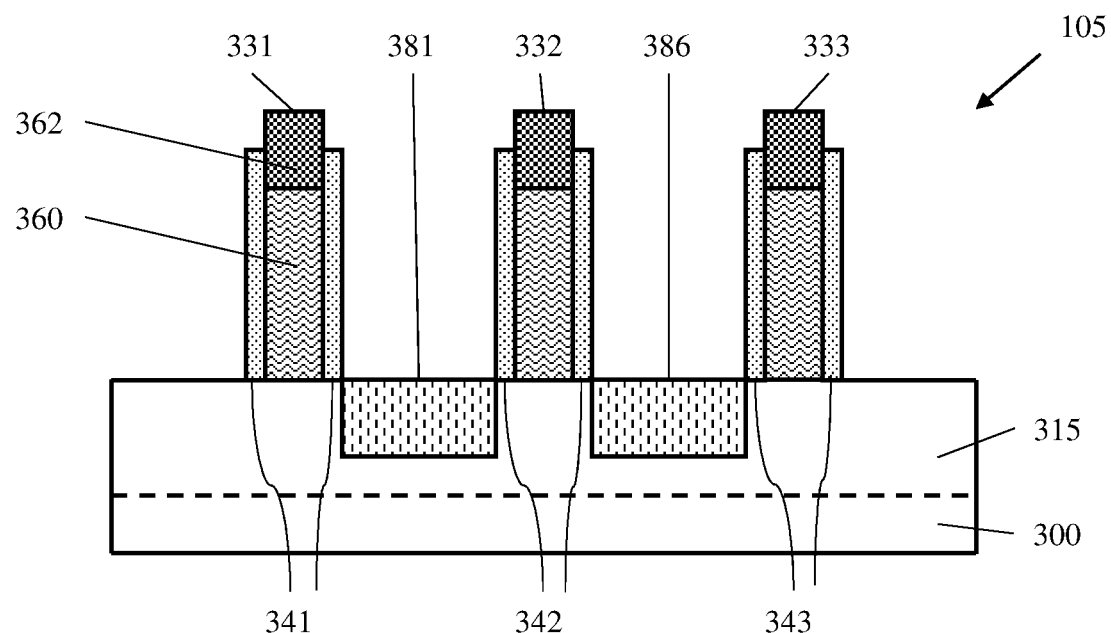

FIGS. 5A and 5B together show cross sections of partially processed IC structure 105 after etching to remove pairs of fin spacers 321, 322, 323, 324, 325 according to embodiments of this disclosure. Etching may be performed by any technique now known or later discovered in the art, including techniques described previously in this disclosure. Etching may also result in gate spacer pull down, i.e., a reduction in the height of pairs of gate spacers 341, 342, 343. Dummy gates 332, 332, 333 may be protected during etching by protective cap material 362 positioned above dummy gate material 360 in each dummy gate.

Figure 6A:
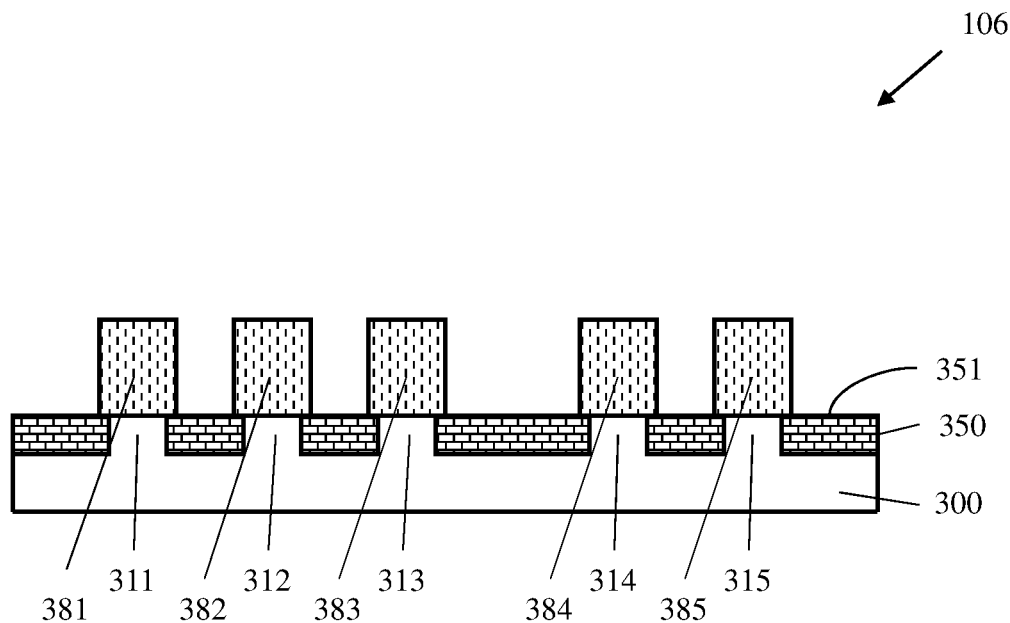
FIGS. 6A and 6B each show a cross section of epitaxially raising the source/drain regions, and the resulting structure according to embodiments of this disclosure.
Figure 6B:
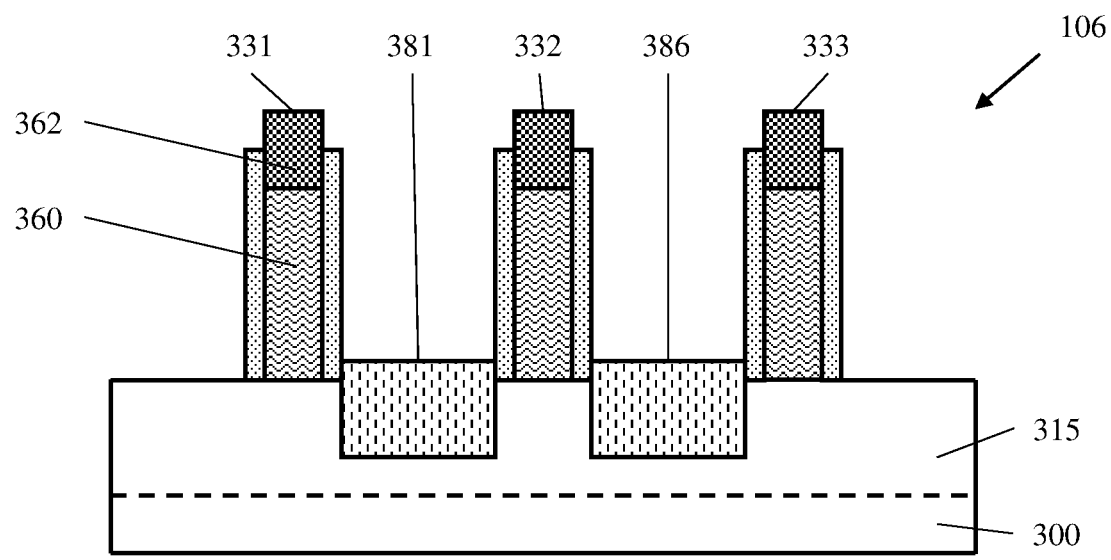

Referring to FIGS. 6A and 6B, the surface area of source/drain regions 381, 382, 383, 384, 385, 386 may optionally be increased by performing an additional depositing step to raise source/drain regions 381, 382, 383, 384, 385, 386 to result in partially processed IC structure 106. In one embodiment, epitaxial growth is employed to conformally deposit additional doped semiconductor material on each source/drain region without fusing (or nearly fusing) source/drain regions on adjacent fins.

Figure 7A:
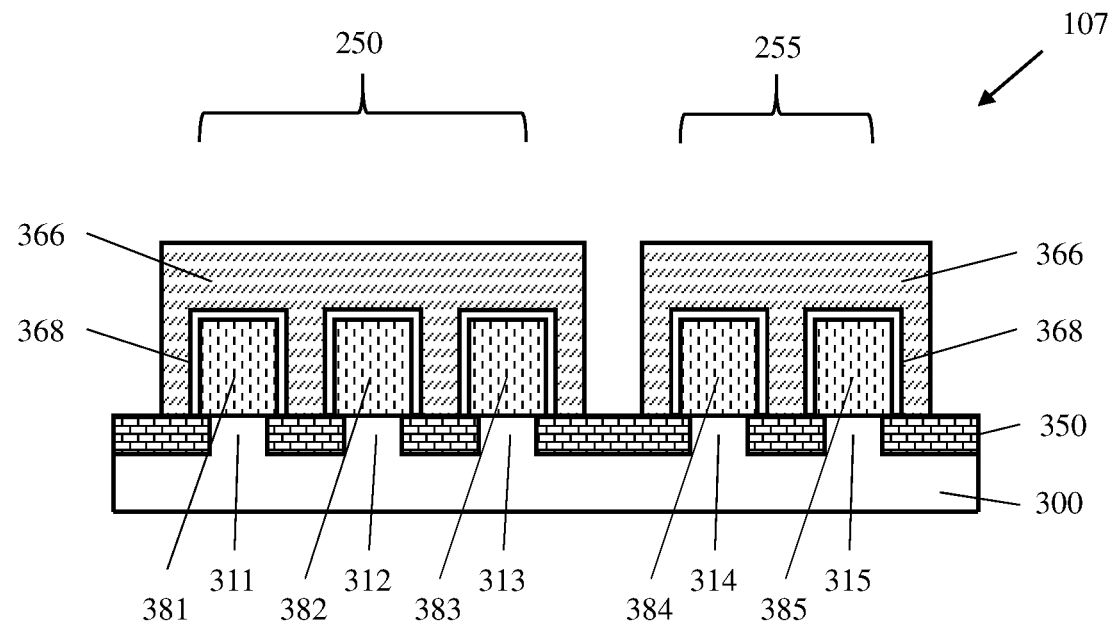
FIGS. 7A and 7B each show a cross section of forming dummy contacts around the source/drain regions, and the resulting structure according to embodiments of this disclosure.
Figure 7B:
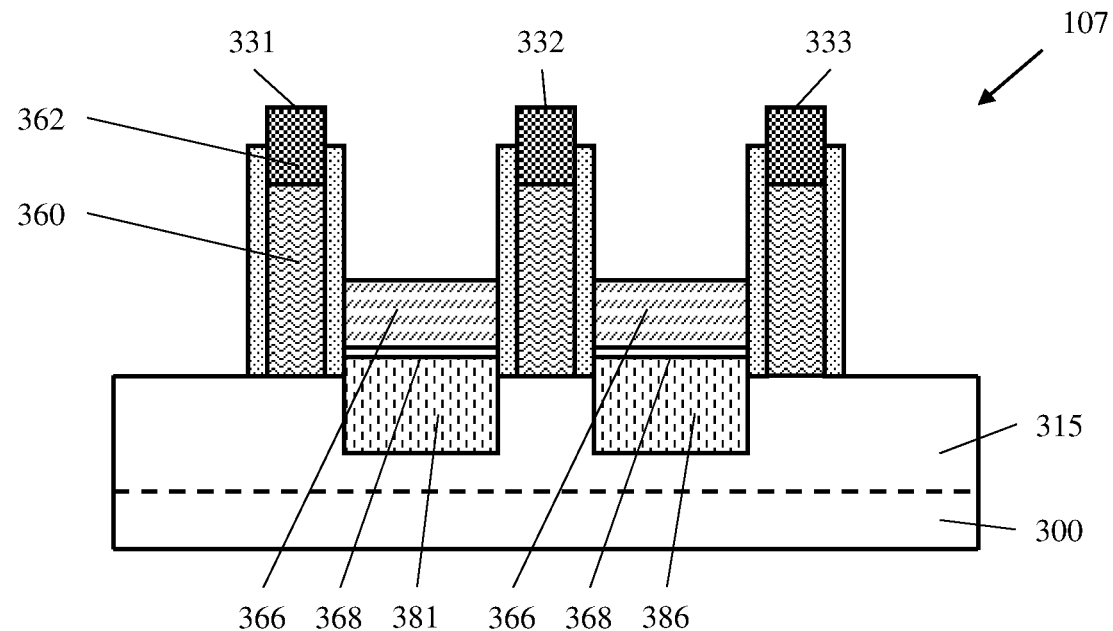

FIGS. 7A and 7B together show cross sections of partially processed IC structure 107 including sacrificial dummy contacts 366 formed on source/drain regions 381, 382, 383, 384, 385, 386 according to embodiments of this disclosure. Dummy contacts 366 may be formed surrounding the top surface and at least a portion of the two opposing lateral sides of each source/drain region. Dummy contacts 366 may include a dummy contact material and may optionally include a protective cladding layer 368 interposed between the dummy contact material and each source/drain region. Dummy contact material 366 may include, e.g., silicon germanium, and protective cladding 368 may include, e.g., silicon.

Dummy contacts 366 may be formed selectively on source drain regions 381, 382, 383, 384, 385, 386, e.g., by epitaxial growth, or may be formed by depositing a layer of material followed by lithographic patterning. Dummy contacts 266 extend contiguously between source/drain regions formed immediately alongside one another on adjacent fins within each subset of fins 250, 255.

In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Figure 8A:
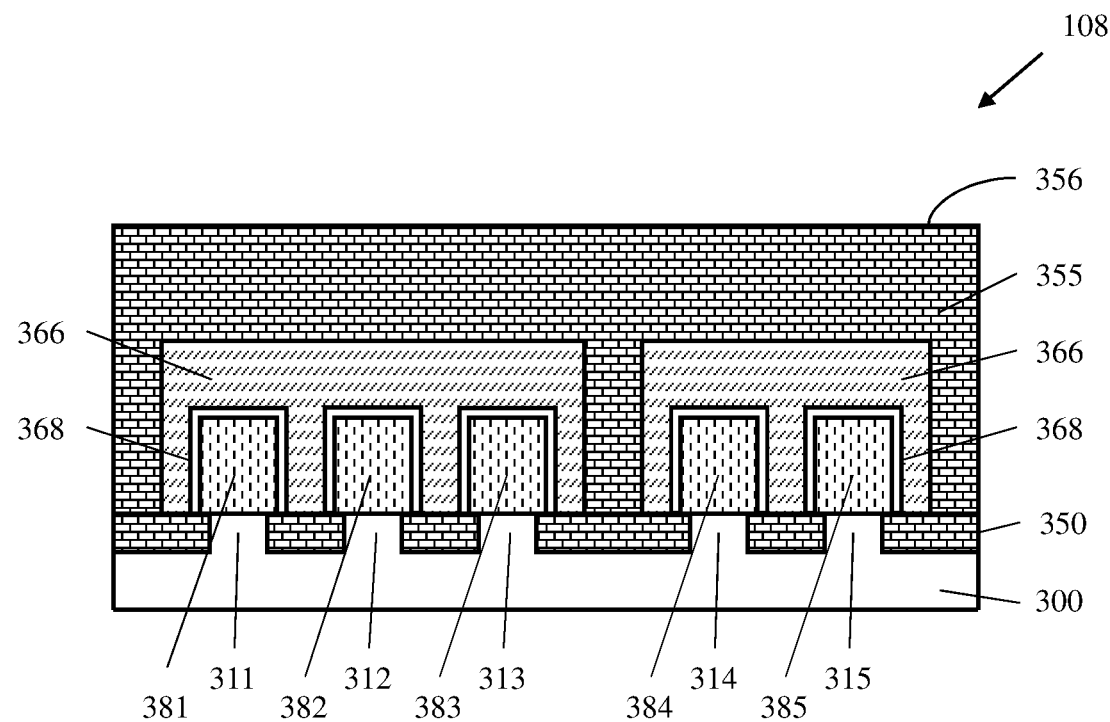
FIGS. 8A and 8B each show a cross section of depositing interlayer dielectric on the dummy contacts, and the resulting structure according to embodiments of this disclosure.
Figure 8B:
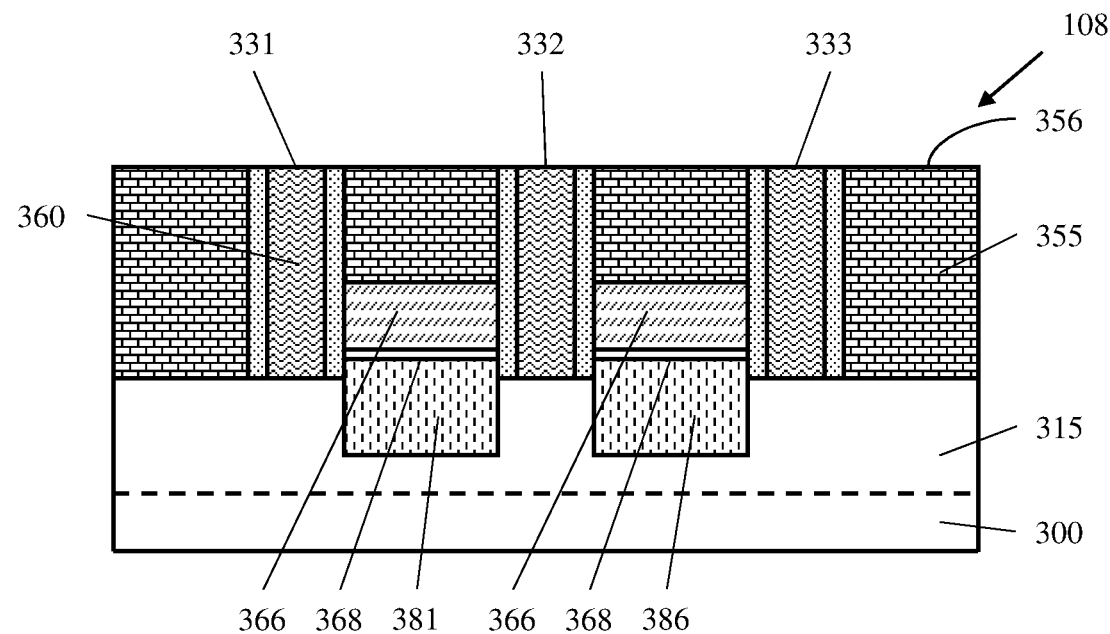

As shown in FIGS. 8A and 8B, second interlayer dielectric (ILD) 355 may be deposited over dummy contacts 366 and over substrate 300, resulting in partially processed IC structure 108 according to embodiments of this disclosure. Second ILD 355 includes a second ILD upper surface 356. Second ILD 355 may include any of the materials described above for first ILD 350. First ILD 350 and second ILD 355 may have the same composition or may have different compositions. Second ILD 355 may be deposited by any now known or later developed technique appropriate for depositing interlayer dielectrics.

Figure 9A:
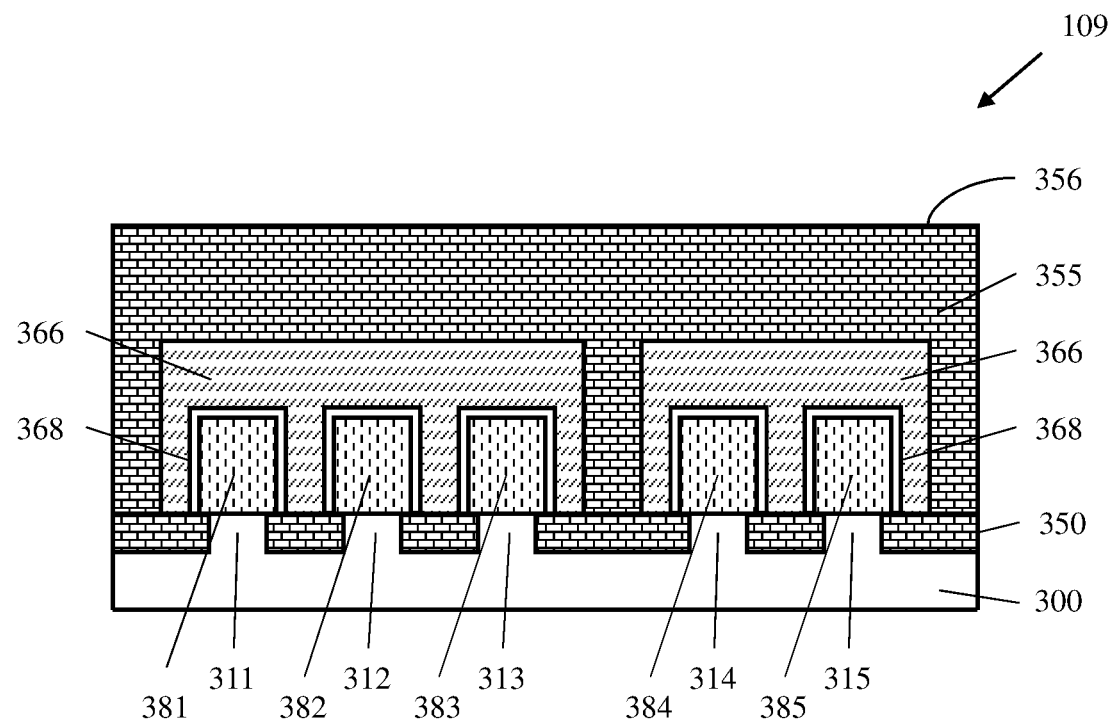
FIGS. 9A and 9B each show a cross section of replacing dummy gates with metal gates, and the resulting structure according to embodiments of this disclosure.
Figure 9B:
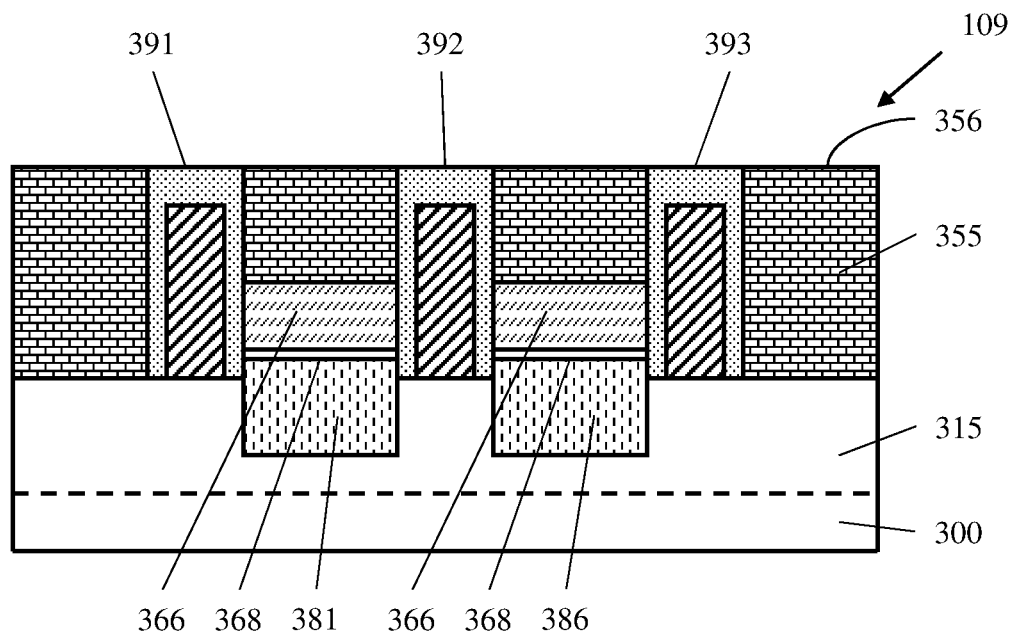

FIGS. 9A and 9B together show cross sections of replacing dummy gates 331, 332, 333 with metal gates 391, 392, 393 and the resulting partially processed IC structure 109 according to embodiments of this disclosure.

Replacing dummy gates may be performed by any replacement metal gate (RMG) process now know or later developed. An example of an RMG process may include removing dummy gates 331, 332, 333 by etching or any other method of removing semiconductor material now know or later developed. After removal of dummy gates 331, 332, 333, an electrically conductive metal is filled in the place left by the dummy gates to form metal gates 391, 392, 393. In one embodiment, the electrically conductive metal may include tungsten. Metal gates 391, 392, 393 may also include additional gate dielectric structures to provide further electrical isolation or to improve gate operating parameters. Examples of gate dielectric materials may include but are not limited to hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material or any combination of these materials. It should be understood that the RMG process is described at this point in the sequence as an example. The RMG process may be carried out at other points in the sequence apparent to those of ordinary skill in the art without departing from the scope and spirit of this disclosure.

Figure 10A:
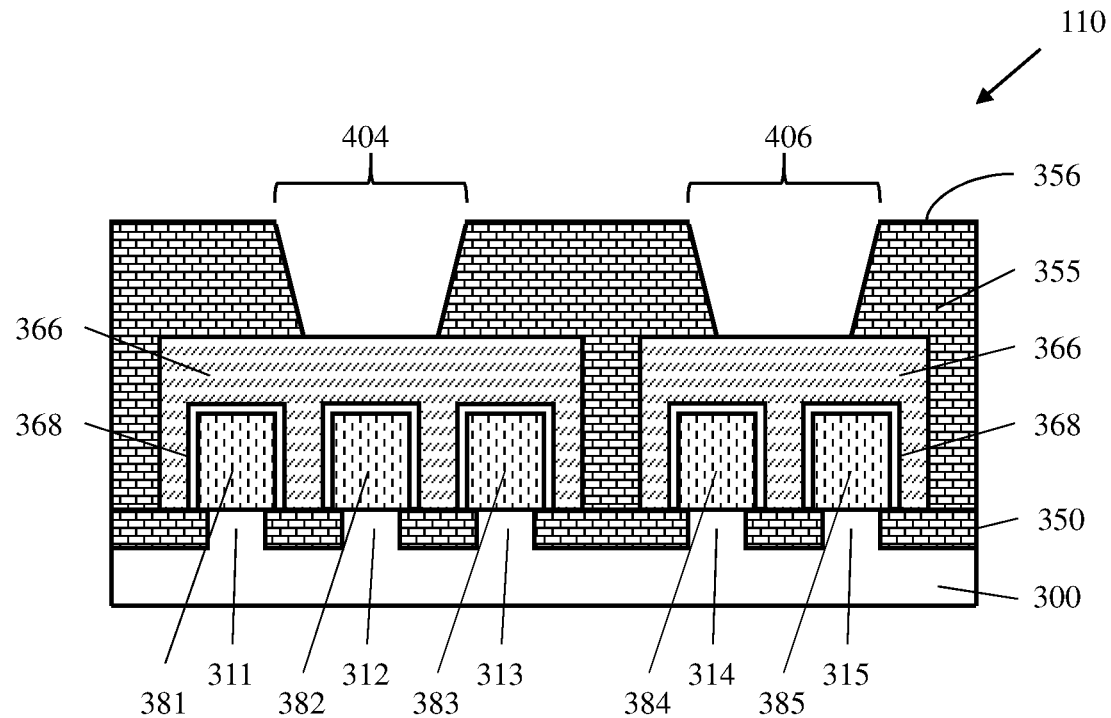
FIGS. 10A and 10B each show a cross section of forming openings in the interlayer dielectric, and the resulting structure according to embodiments of this disclosure.
Figure 10B:
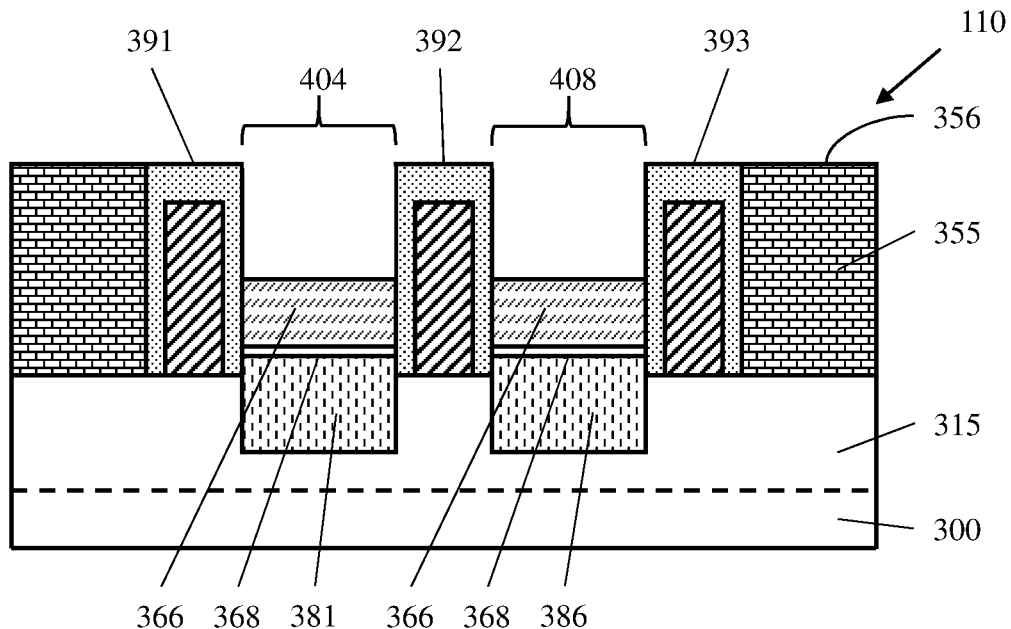

As shown in FIGS. 10A and 10B, after second ILD 255 is deposited, first openings 404, 406 may be formed in second ILD 255 to dummy contacts 366. FIGS. 10A and 10B together show cross sections of the resulting partially processed IC structure after forming openings 404, 406 according to embodiments of this disclosure. First openings 404, 406 may be formed by patterning a mask (not shown) and etching or any other method of removing dielectric material now know or later developed.

Figure 11A:
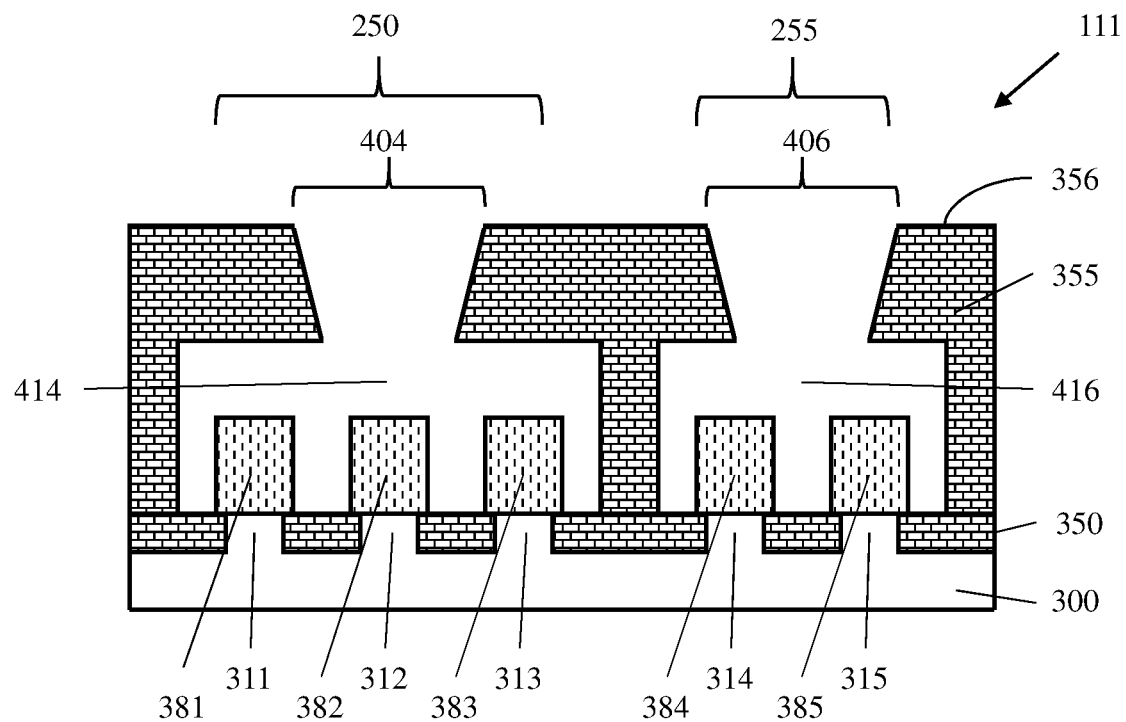
FIGS. 11A and 11B each show a cross section of removing the dummy contacts, and the resulting structure according to embodiments of this disclosure.
Figure 11B:
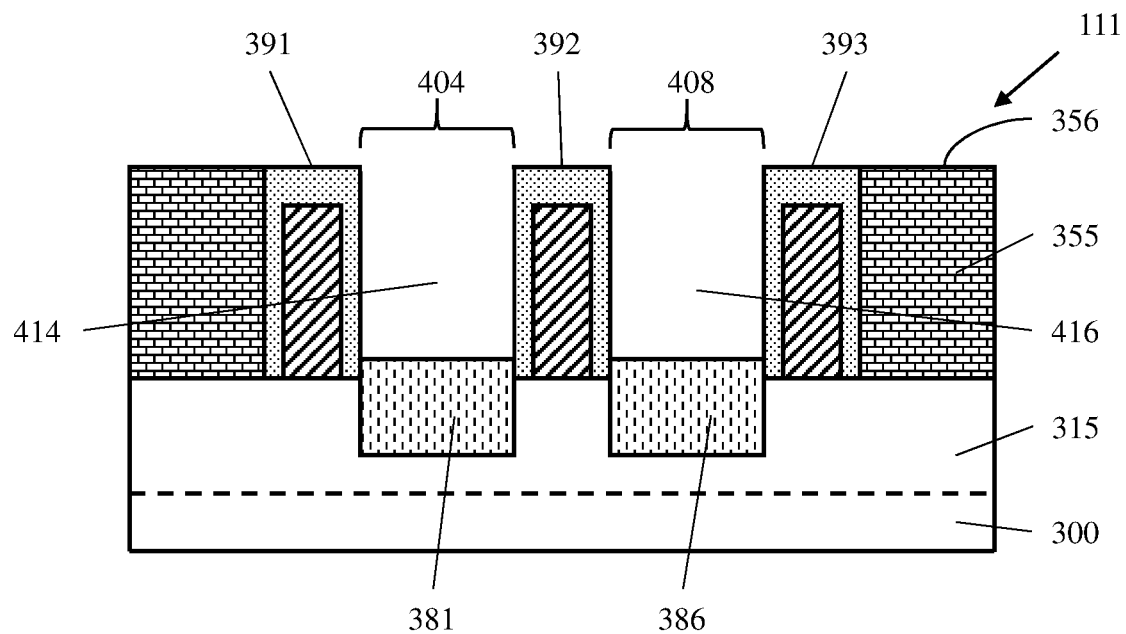

FIGS. 11A and 11B show removing dummy contacts 366, creating second openings 414, 416 contiguous with first openings 404, 406. FIGS. 11A and 11B together show cross sections after removing the dummy contacts, and the resulting partially processed IC structure 111 according to embodiments of this disclosure.

Second openings 414, 416 may be formed by etching or any other method of removing sacrificial material now know or later developed. In one embodiment, second openings 414, 416 are formed by first removing dummy contact material 366 with a wet etch process, followed by a second wet etch process to remove protective cladding 368. It will be apparent that second openings 414, 416 surround the top surface and at least a portion of the two opposing lateral sides of each source/drain region, as was the case for dummy contacts 266. Additionally, second openings 414, 416 also extend contiguously between source/drain regions formed immediately alongside one another on adjacent fins within each subset of fins 250, 255.

Figure 12A:
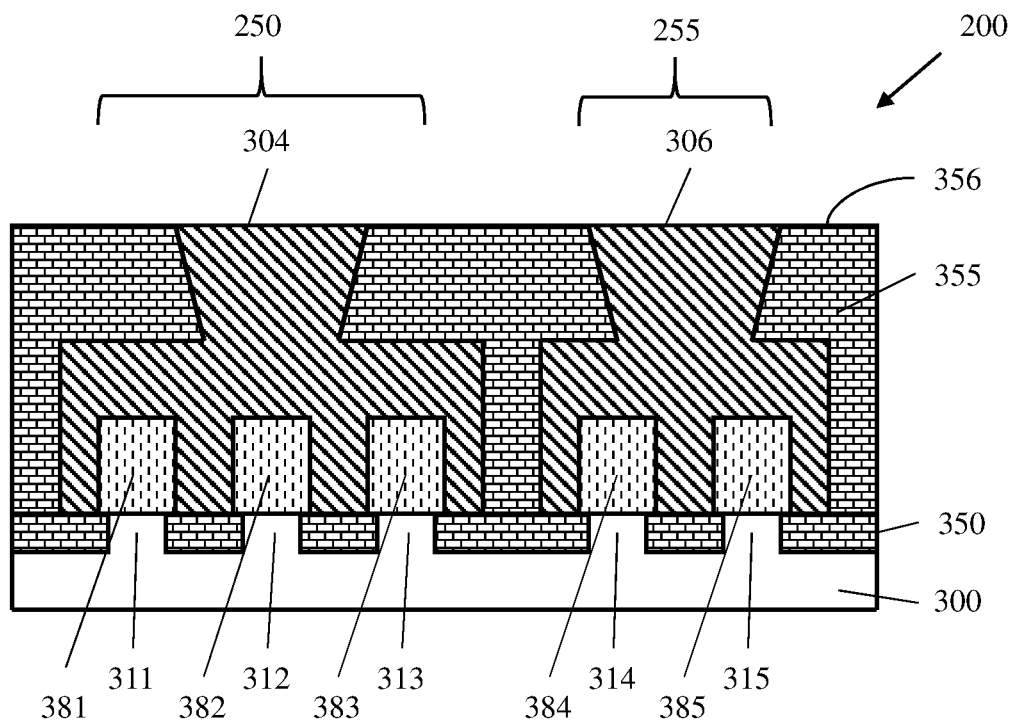
FIGS. 12A and 12B each show a cross section of forming metal contacts wrapping around the source/drain regions in place of the previously removed dummy contacts, and the resulting example integrated circuit structure after processing according to embodiments of this disclosure.
Figure 12B:
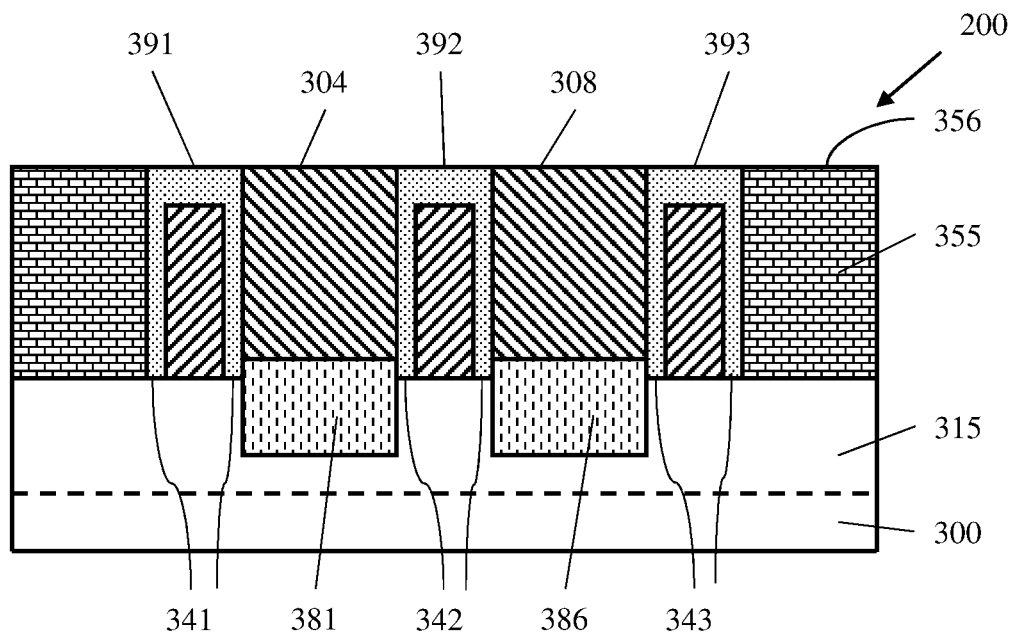
Figure 13:
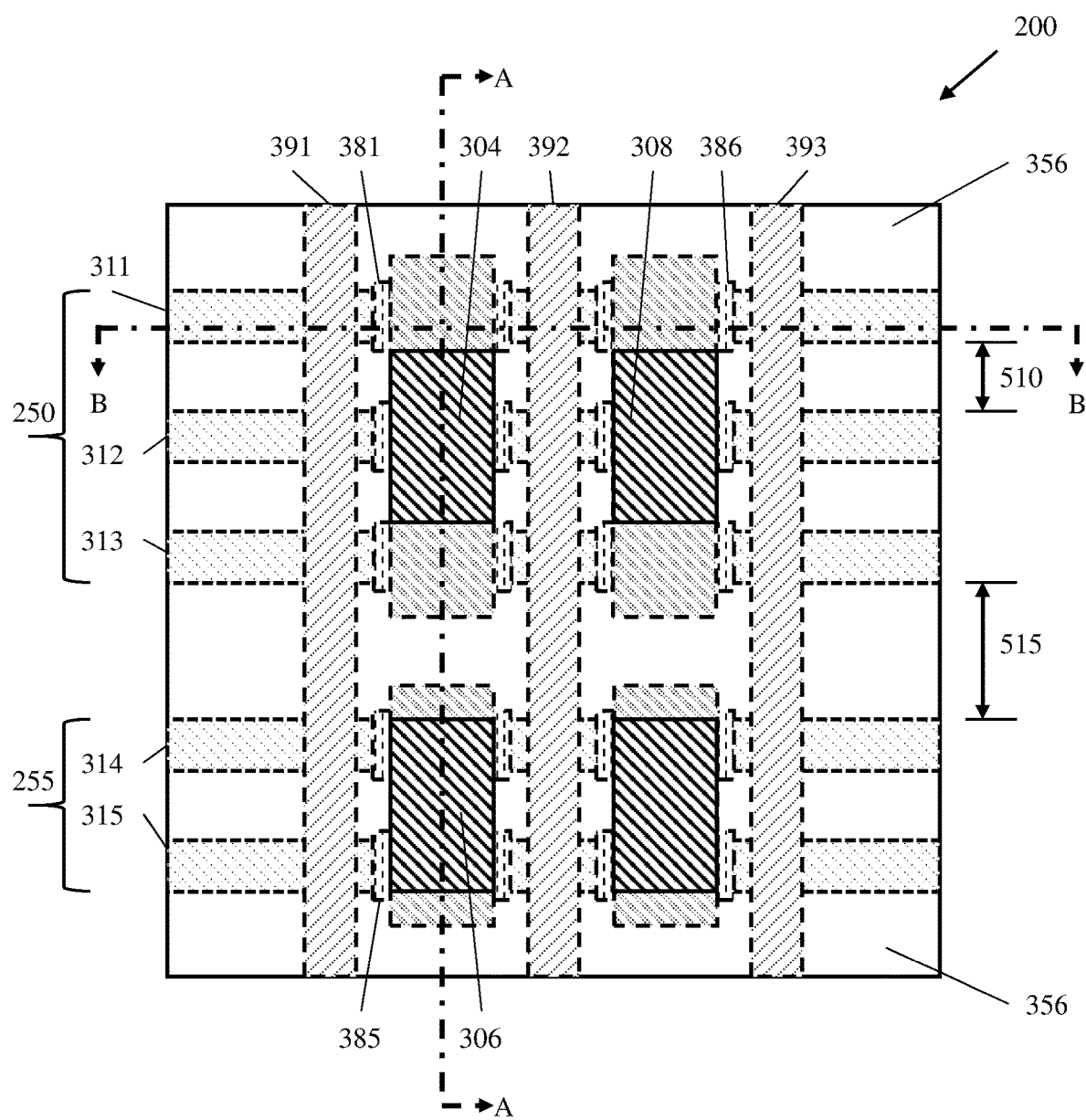
FIG. 13 shows a plan view of the example integrated circuit structure shown in FIGS. 12A and 12B after processing according to embodiments of this disclosure. The line A-A designates the location of the cross section shown in FIG. 12A, and the line B-B designates the location of the cross section shown in FIG. 12B.

FIGS. 12A, 12B, and 13 show forming metal contacts 304, 306 may be formed in first openings 404, 406 and second openings 414, 416, resulting in the example integrated circuit structure 200. Metal contacts 304, 306 may be formed by depositing an electrically conductive metal in the openings 404, 406, 414, 416 by any process now known or later developed in the art. In various embodiments, the electrically conductive metal may include one or more of tungsten (W), ruthenium (Ru), cobalt (Co), copper (Cu), or aluminum (Al).

FIGS. 12A, 12B, and 13 together show an example integrated circuit structure 200 after processing according to embodiments of this disclosure. FIGS. 12A and 12B are cross sections of the integrated circuit structure. FIG. 13 is a plan view of the example integrated circuit structure, with the cross section of FIG. 12A along the line A-A, and the cross section of FIG. 12B along the line B-B. For clarity, some structures are not shown in FIG. 13, including second ILD 355 and some structures are shown without reference numbers.

It will be apparent that metal contacts 304, 306 also extend over the top surface and around at least part of the sides of each source/drain region, as was the case for dummy contacts 266 and second openings 414, 416. As a result, the surface area available for electrical conduction between contacts 304, 306 and respective source/drain regions 311, 312, 313, 314, 315 is significantly increased. Increased surface area for electrical conduction reduces the resistance to current flow. Additionally, the geometry of source/drain regions formed according to embodiments of this disclosure has the desirable result of shorter average distances for charge carriers to travel through the source/drain regions to reach the active channel than previously known methods. Due to the more favorable geometry, current flow through the channel is more evenly distributed.

It may be desirable for the integrated circuit structure to include fins with variable widths. Specifically, portions of fins underneath metal gates may be narrower than portions of fins in which source/drain regions are positioned. A narrower fin underneath a metal gate results in a narrower channel region and may improve operating characteristics of the integrated circuit structure.

Figure 14:
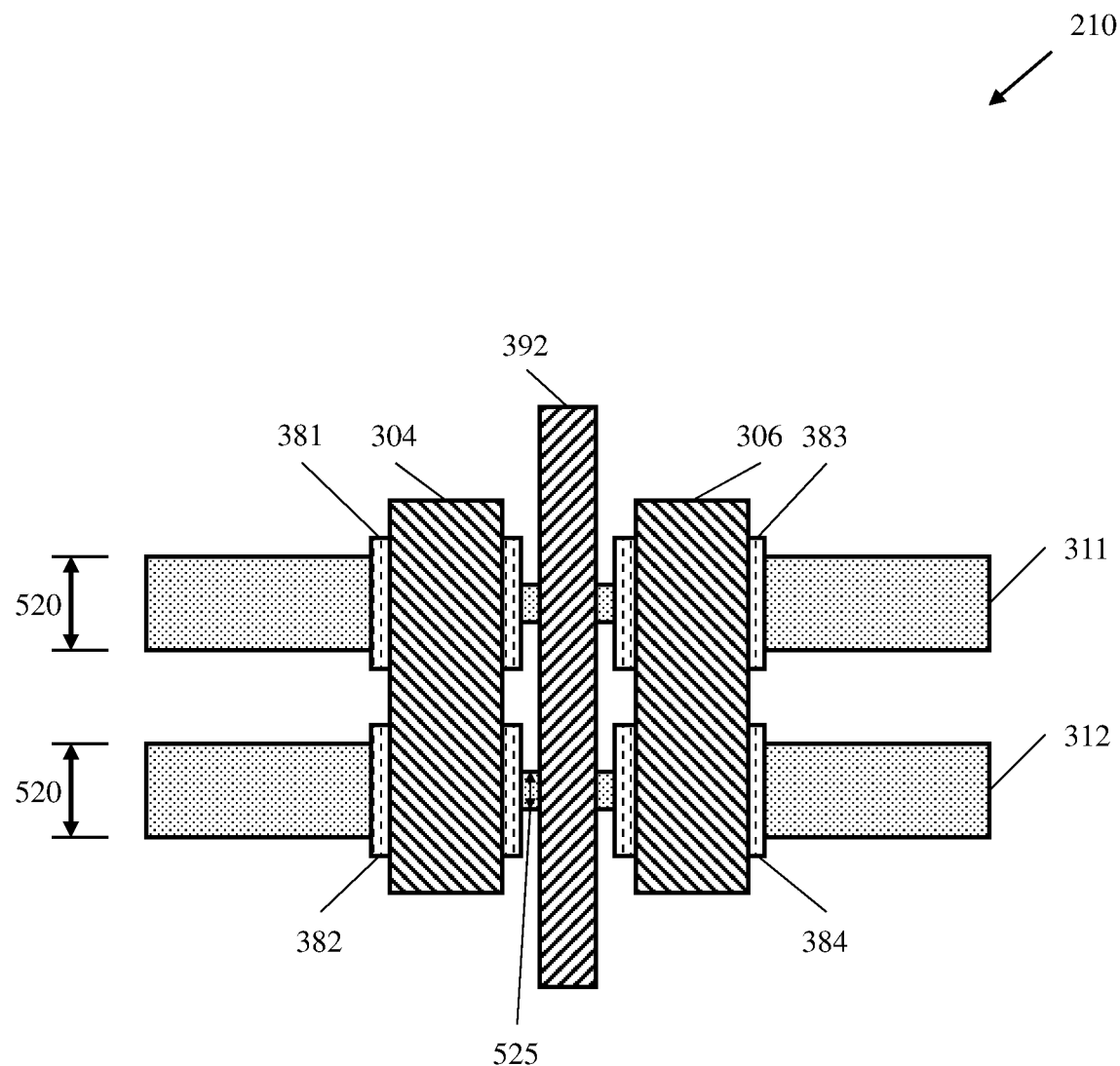
FIG. 14 shows a plan view of an example integrated circuit structure including reduced width of the fins underneath a gate according to embodiments of this disclosure.

FIG. 14 shows a plan view of an example integrated circuit structure including reduced width of fins 311, 312 underneath metal gate 381 according to embodiments of this disclosure. As described above, source/drain regions 381, 382, 383, 384 are formed in fins 311, 312 adjacent to metal gate 392. Metal contacts 304, 306 are formed surrounding the top surface and at least a portion of the two opposing lateral sides of each of the source/drain regions 381, 382, 383, 384. For clarity, substrate 300 and ILDs 350, 355 are not shown. As shown in FIG. 14, a width 525 of portions of fins 311, 312 underneath metal gate 392 is less than another width 520 of a second portion of fins 311, 312 in which source/drain regions 381, 382, 383, 384 are formed. The portions of fins 311, 312 having narrower width 525 may be included in precursor structure 100. Alternatively, the replacement metal gate (RMG) process may include processes, e.g., selective etching, that reduce the width of portions of fins 311, 312 underneath metal gate 392.

The disclosed method provides an integrated circuit (IC) structure, for example the non-limiting integrated circuit structure embodiment 200 shown in FIGS. 12A, 12B, and 13. Integrated circuit structure 200 includes a semiconductor substrate 300 having a plurality of semiconductor fins 311, 312, 313, 314, 315 extending from the substrate 300. Each source/drain region of a first set of source/drain regions 381, 382, 383 may be positioned in one fin of a first subset 250 of at least two adjacent fins 311, 312, 313 of the plurality of fins. Each source/drain region 381, 382, 383 encompasses a top surface and two opposing lateral sides of a respective fin and is spaced from all other source/drain regions. Each source/drain region of a second set of source/drain regions 384, 385 may be positioned in one fin of a second subset 255 of at least two adjacent fins 314, 315 of the plurality of fins. Each source/drain region 384, 385 of the second set of source/drain regions encompasses a top surface and two opposing lateral sides of a respective fin and is spaced from all other source/drain regions. First subset 250 and second subset 255 each include different fins from the other subset.

Integrated circuit structure 200 may also include a first metal contact 304 positioned over the first set of source/drain regions 381, 382, 383. First metal contact 304 surrounds the top surface and at least a portion of the two opposing lateral sides of each source/drain region of the first set of source/drain regions 381, 382, 383. Integrated circuit structure 200 may further include second metal contact 306 formed over the second set of source/drain regions 384, 385. Second metal contact 306 surrounds the top surface and at least a portion of the two opposing lateral sides of each source/drain region of the second set of source/drain regions 384, 385. Each set of source/drain regions and the corresponding metal contact is in mutual electrical communication.

Embodiments according to this disclosure may include additional source/drain regions positioned in each fin and/or additional sets of source/drain regions positioned in each subset of adjacent fins, and metal gates positioned between each source/drain region along the same fin. For example the non-limiting integrated circuit structure 200 also includes source/drain region 386 positioned in fin 311 and metal gate 392 positioned on fin 311 between source/drain region 381 and source/drain region 386. Metal gate 392 controls the flow of current along fin 311 between source/drain region 381 and source/drain region 386. Metal contact 308 extends over source/drain region 386, surrounding the top surface and at least a portion of the two opposing lateral sides of source/drain region 386.

Fins 311, 312, and 313 within first subset 250 of adjacent fins may each be approximately spaced from one another by first spacing 510. Fins 314 and 315 within second subset 255 of adjacent fins may also each be approximately spaced from one another by first spacing 510. First subset of fins 250 may be approximately spaced from second subset of fins 255 by second spacing 515 different than first spacing 510. Typically, second spacing 515 will be larger than first spacing 510. In some embodiments according to this disclosure, second spacing 515 will be less than three times first spacing 510. One benefit of the integrated circuit structure and method described in this disclosure is this reduced spacing between adjacent circuit elements compared to conventional methods.

Embodiments of this disclosure may also provide integrated circuit structures including fins with variable widths. Specifically, portions of fins underneath metal gates may be narrower than portions of fins in which source/drain regions are positioned. A narrower fin underneath a metal gate results in a narrower channel region and may improve operating characteristics of the integrated circuit structure.

For example, non-limiting integrated circuit structure embodiment 210 shown in FIG. 14 shows a plan view of an example integrated circuit structure according to embodiments of this disclosure including reduced width of fins 311, 312 underneath metal gate 391. As described previously, source/drain regions 381, 382, 383, 384 are positioned in fins 311, 312 adjacent to metal gate 392. Metal contacts 304, 306 are positioned surrounding the top surface and at least a portion of the two opposing lateral sides of each of the source/drain regions 381, 382, 383, 384. For clarity, substrate 300 and ILDs 350, 355 are not shown. As shown in FIG. 14, a width 525 of portions of fins 311, 312 underneath metal gate 392 is less than another width 520 of a second portion of fins 311, 312 in which source/drain regions 381, 382, 383, 384 are positioned.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth herein may be registered trademarks (®).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a semiconductor substrate, including a first fin and a second fin spaced from the first fin;
   a first source/drain region in the first fin, the first source/drain region encompassing a top surface and two opposing lateral sides of the first fin;
   a second source/drain region in the second fin, the second source/drain encompassing a top surface and two opposing lateral sides of the second fin;
   a first metal contact extending over the first source/drain region and the second source/drain region and surrounding the top surface and at least a portion of the two opposing lateral sides of each of the first and the second source/drain regions;

a third source/drain region in the first fin spaced from the first source/drain region, the third source/drain region encompassing the top surface and the two opposing lateral sides of the first fin;

a fourth source/drain region in the second fin spaced from the second source/drain region, the fourth source/drain region encompassing the top surface and the two opposing lateral sides of the second fin;

a second metal contact extending over the third source/drain region and the fourth source/drain region and surrounding a top surface and at least a portion of two opposing lateral sides of each of the third and the fourth source/drain regions; and a metal gate positioned on the first fin between the first source/drain region and the third source/drain region, and positioned on the second fin between the second source/drain region and the fourth source/drain region, wherein a first portion of the first fin underneath the metal gate has a first width that is less than a second width of a second portion of the first fin in which the first source/drain region is positioned.

2. The IC structure of claim 1, further comprising:

a third fin on the semiconductor substrate spaced from the first fin and the second fin; and the third source/drain region encompassing a top surface and two opposing lateral sides of the third fin, wherein the first metal contact extends over the third source/drain region and surrounds the top surface and at least a portion of the two opposing lateral sides of the third source/drain region.

3. The IC structure of claim 1, wherein the first source/drain region is spaced from the second source/drain region.

4. An integrated circuit (IC) structure, comprising:

a semiconductor substrate;

a plurality of semiconductor fins extending from the substrate;

a first set of source/drain regions each positioned in one fin of a first subset of adjacent fins of the plurality of fins, each source/drain region of the first set of source/drain regions encompassing a top surface and two opposing lateral sides of a respective fin, wherein the first subset of adjacent fins includes at least two fins;

a second set of source/drain regions each positioned in one fin of a second subset of adjacent fins of the plurality of fins, each source/drain region of the second set of source/drain regions encompassing a top surface and two opposing lateral sides of a respective fin, wherein the second subset of adjacent fins includes at least two fins and the second subset of adjacent fins are different than the first subset of adjacent fins;

a first metal contact positioned over the first set of source/drain regions, wherein the first metal contact surrounds the top surface and at least a portion of the two opposing lateral sides of each source/drain region of the first set of source/drain regions;

a second metal contact positioned over the second set of source/drain regions, wherein the second metal contact surrounds the top surface and at least a portion of the two opposing lateral sides of each source/drain region of the second set of source/drain regions; and a metal gate positioned on one fin of the first subset of adjacent fins and on one fin of the second subset of adjacent fins, the metal gate positioned between the first set of source/drain regions and the second set of source/drain regions wherein a first portion of the one fin of the first subset of fins is underneath the metal gate and has a first width that is less than a second width of a second portion of the one fin of the first subset of fins in which the first source/drain regions are positioned.

5. The IC structure of claim 4, wherein each source/drain region of the first set of source/drain regions is spaced from every other source/drain region of the first set of source/drain regions, and wherein each source/drain region of the second set of source/drain regions is spaced from every other source/drain region of the second set of source/drain regions.

6. The IC structure of claim 4, wherein a first spacing between the first subset of adjacent fins and the second subset of adjacent fins is less than three times a second spacing between adjacent fins in the first subset of adjacent fins.

\* \* \* \* \*